United States Patent [19]

Kim et al.

[11] Patent Number: 5,352,630
[45] Date of Patent: Oct. 4, 1994

[54] METHOD FOR FORMING INTER-METAL DIELECTRICS IN A SEMICONDUCTOR DEVICE

[75] Inventors: Chang-Gyu Kim, Kyungki; Ji-Hyun Choi, Seoul, both of Rep. of Korea

[73] Assignee: Samsung Electronics Co., Ltd., Kyungki, Rep. of Korea

[21] Appl. No.: 956,853

[22] Filed: Oct. 2, 1992

[30] Foreign Application Priority Data

Oct. 10, 1991 [KR] Rep. of Korea ............... 1991-17740

[51] Int. Cl.$^5$ ................. H01L 21/44; H01L 21/48
[52] U.S. Cl. .................... 437/195; 437/228; 437/231; 437/235; 437/238
[58] Field of Search ............ 437/195, 228, 238, 982, 437/231, 235; 156/643

[56] References Cited

U.S. PATENT DOCUMENTS

| | | |
|---|---|---|
| 4,474,831 | 10/1984 | Downey ............... 437/982 |
| 4,535,528 | 8/1985 | Chen et al. ............ 437/982 |
| 4,839,311 | 6/1989 | Riley et al. ........... 437/228 |
| 4,986,878 | 1/1991 | Malazgirt et al. .... 156/643 |
| 5,051,380 | 9/1991 | Maeda ................... 437/238 |
| 5,160,986 | 11/1992 | Bellezza ................ 257/316 |

*Primary Examiner*—Olik Chaudhuri
*Assistant Examiner*—H. Jey Tsai
*Attorney, Agent, or Firm*—Robert A. Westerlund; Stephen R. Whitt; Charles R. Donohoe

[57] ABSTRACT

A method for forming an inter-metal dielectrics in a semiconductor device includes the steps of sequentially forming a first and second insulating layers over a semiconductor substrate with a patterned metal layers, etching-back the second insulating layer so as to form second insulating spacers over the side walls of the first insulating layer, and growing a third insulating layer over the first and second insulating layers, the growing speed of the third insulating layer being different from the region over the first insulating layer to the region over the second insulating layer.

11 Claims, 4 Drawing Sheets

METHOD FOR FORMING INTER-METAL DIELECTRICS IN A SEMICONDUCTOR DEVICE

TECHNICAL BACKGROUND

The present invention relates to a method for fabricating a semiconductor device, and more particularly to a method for forming inter-metal dielectrics in a semiconductor device.

Recently the highly integrated semiconductor device tends to have multiple conductive layers, which intensifies the importance of flatness of the insulating layers between the metal layers. In order to achieve the flatness of the insulating layers between the multiple metal layers in a semiconductor device, there are generally used spin-on glass process, etch-back process, or resinous insulating process using polyimide. However these accompany problems such as voids, cracks, etc. produced in the regions between the conductive lines during the planarization process because the conductive lines have increased step differences and the intervals between the conductive lines are in order of submicrons.

There is shown a conventional spin-on glass planarization process in FIGS. 1A–1D. In this case, the starting material is a semiconductor substrate with lower conductive lines 3. The process for forming transistors, capacitors, etc. is neglected in the drawings. Referring to FIG. 1A, a second insulating layer 5 of oxide is deposited over a semiconductor substrate (not shown) with a first insulating layer 1 of BPSG (Boro-Phospho-Silicate Glass) and a first metal layer 3 forming the lower conductive lines. In the step of FIG. 1B, a third insulating layer 7 of spin-on glass is coated and subjected to heat treatment. The third insulating layer is usually coated several times to improve the step coverage and avoid the cracks. In the step of FIG. 1C, the spin-on glass layer 7 is etched-back so as to expose the portions of the insulating layer 5 over the first metal layer 3. In the step of FIG. 1D, a fourth insulating layer 9 for buffering is finally laid over the substrate completing the planarization of the insulating layer between the lower and upper conductive lines. However, the spin-on glass layer 7 is so weak as to be easily cracked, so that the reliability of the semiconductor device could not be secured.

SUMMARY OF THE INVENTION

It is an object of the present invention to provide a method for forming inter-metal dielectrics without voids in a semiconductor device.

It is another object of the present invention to provide a method for forming inter-metal dielectrics in a semiconductor device, which inter-metal dielectrics have a good resistivity against cracking and a good planarization.

According to the present invention, the planarization process includes the steps of exposing different insulating layers over different regions of a semiconductor substrate and depositing a lower-layer-dependable insulating layer such as $O_3$—TEOS USG ($O_3$—Tetra—Ethyl—Ortho—Silicate Undoped Silicate Glass) on the different insulating layers without using a spin-on glass layer.

The present invention will now be described with reference to the drawings attached only by way of example.

BRIEF DESCRIPTION OF THE ATTACHED DRAWINGS

DETAILED DESCRIPTION OF PREFERRED EMBODIMENTS

Figure 1A:
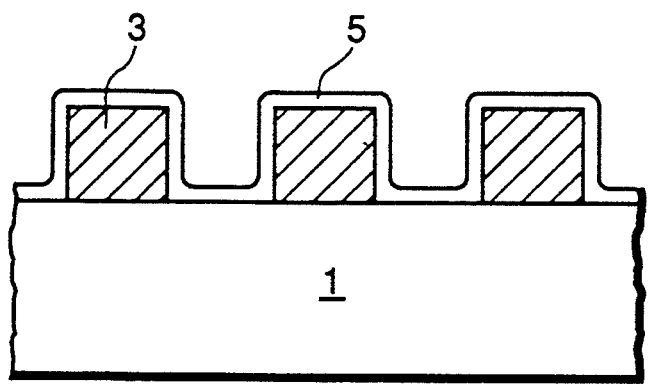
FIGS. 1A to 1D are cross sectional views for schematically illustrating a conventional method of forming inter-metal dielectrics.
Figure 1B:
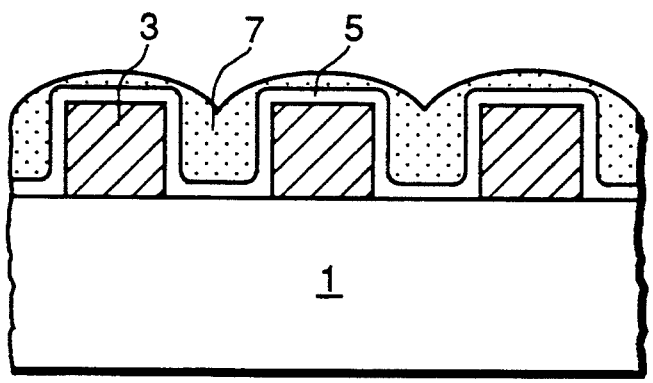
Figure 1C:
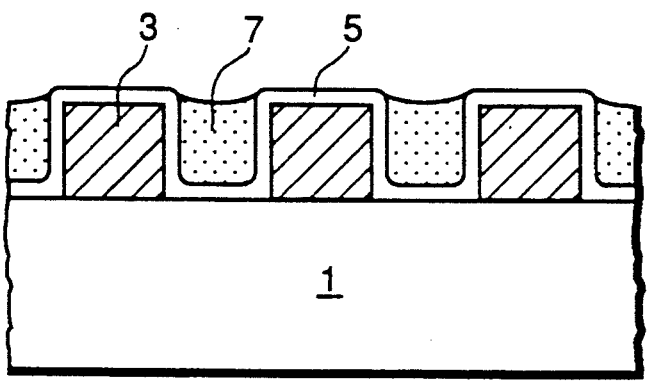
Figure 1D:
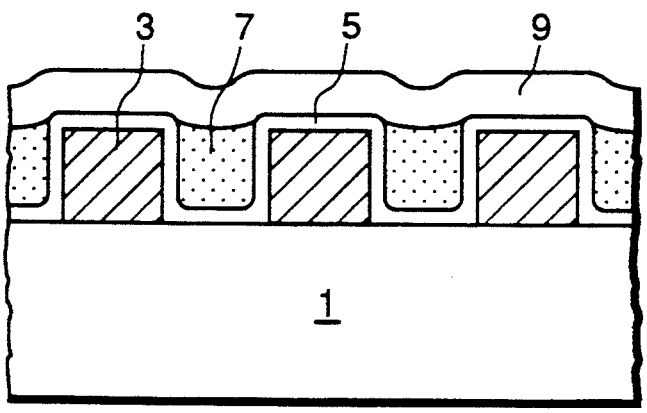
Figure 2A:
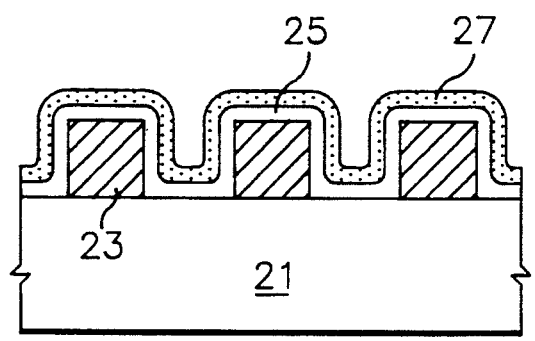
FIGS. 2A to 2C are cross sectional views for schematically illustrating a method of forming inter-metal dielectrics according to an embodiment of the present invention.
Figure 2B:
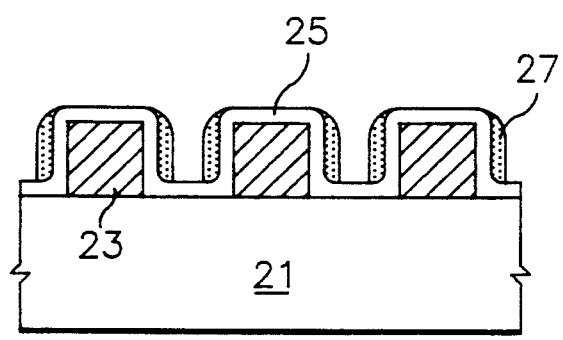
Figure 2C:
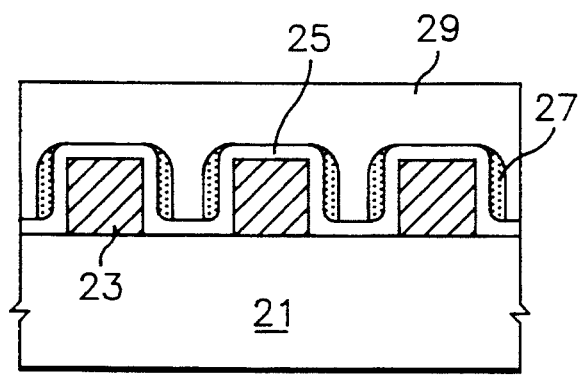

Referring to FIGS. 2A–2C, a first insulating layer 25 with about 1000Å thickness and a second insulating layer 27 with about 1000Å are sequentially formed over a semiconductor substrate (not shown) with an inter-metal dielectric 21 formed of BPSG and a first metal layer 23 forming lower conductive lines in the step of FIG. 1A. The first insulating layer 25 consists of PSG (Phospho—Silicate Glass), $O_3$—TEOS PSG ($O_3$—Tetra—Ethyl—Ortho—Silicate Phospho—Silicate—Glass), $O_3$—TEOS BPSG, or P—TEOS USG (Plasma-enhanced Tetra Ethyl Ortho Silicate Undoped Silicate Glass), and the second insulating layer 27 consists of P—$SiH_4$ USG (Plasma-enhanced Silane Undoped Silicate Glass) or $O_3$—TEOS USG. In the step of FIG. 2B, the second insulating layer 27 is etched-back so as to form spacers 27 of the second insulating layer over the side walls of the first insulating layer 25. In the step of FIG. 2B, a third insulating layer 29 whose deposition rate depends on the lower layer is laid with about 6000Å thickness over the substrate. The third insulating layer 29 is an oxide layer such as $O_3$—TEOS USG whose deposition rate depends on the lower layer and thus is higher in the region over the second insulating spacer 27 than in the region over the first insulating layer 25. As a result there is obtained a flat insulating layer without voids even if the intervals between the conductive lines are narrow and the step differences are greatly increased.

Figure 3A:
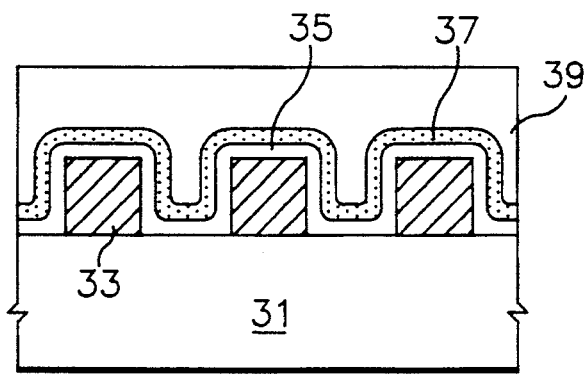
FIGS. 3A to 3D are cross sectional views for schematically illustrating method of forming inter-metal dielectrics according to another embodiment of the present invention.
Figure 3B:
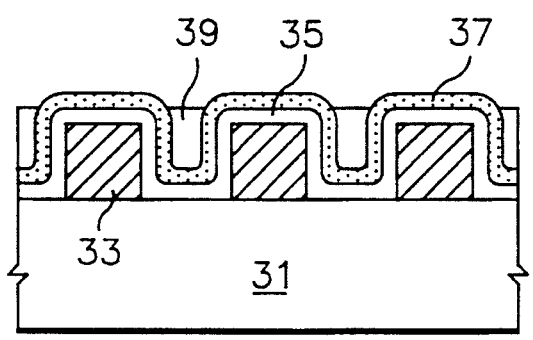
Figure 3C:
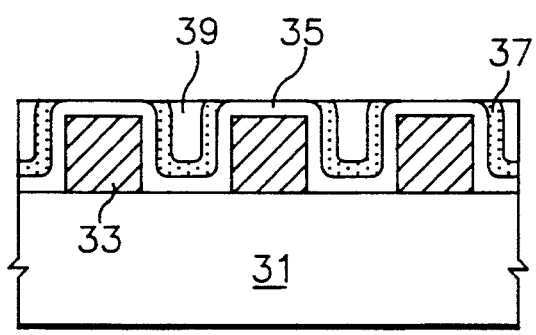
Figure 3D:
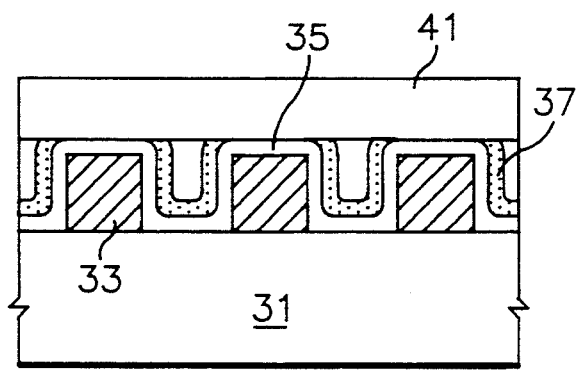

Referring to FIGS. 3A–3D, over a semiconductor substrate (not shown) with an inter-metal dielectric 31 and first metal layer 33 forming the lower conductive lines are there sequentially formed an insulating layer 35 with about 1000Å thickness, second insulating layer 37 with about 1000Å thickness and photoresist 39, in the step of FIG. 3A. The first insulating layer 35 consists of PSG, $O_3$—TEOS PSG, $O_3$—TEOS BPSG, P—TEOS USG, and the second insulating layer 37 P—$SiH_4$ USG or $O_3$—TEOS USG. In the step of FIG. 3B, the photoresist 39 is etched-back so as to expose the second insulating layer 37 thereby leaving the photoresist portions in the recesses between the first metal layers 33. In the step of FIG. 3C, the exposed portions of the second insulating layer 37 are removed by using the remaining photoresist portions as a mask. Then a third insulating layer 41 of $O_3$—TEOS USG is formed over the substrate after removing the photoresist 39, in the step of FIG. 3D. The deposition rate of the third insulating layer 41 depends on the property of the lower insulating layer. Namely, the deposition rate of the third insulating layer 41 is greater in the region over the second insulating layer 37 than in the region over the first insulating layer 35. As a result the portions of the third insulating layer between the metal layers 33 have a thickness great enough to compensate for the depth of the recesses between the metal layers, thus preferably planarizing the inter-metal dielectric. In the present embodiment, a photoresist mask is employed to cause portions of the second insulating layer to remain in the predetermined regions, but the spin-on glass layer may be employed in other embodiments.

Figure 4A:
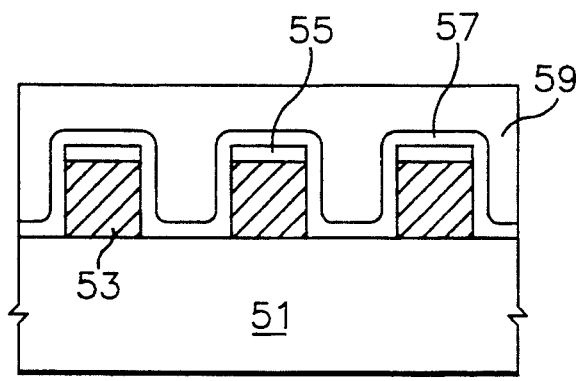
FIGS. 4A to 4D are cross sectional views for schematically illustrating a method of forming inter-metal dielectrics according to a further embodiment of the present invention.
Figure 4B:
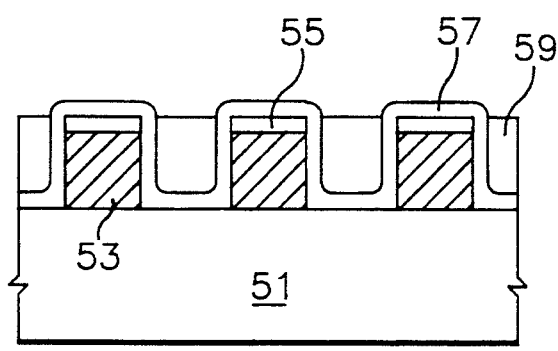
Figure 4C:
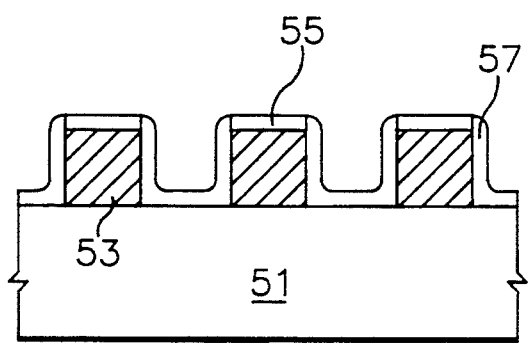
Figure 4D:
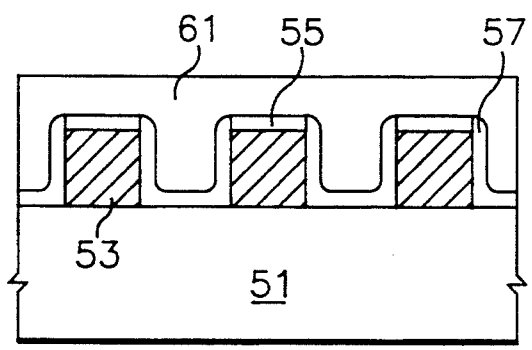

Referring to FIGS. 4A-4D, a metal layer 53 forming the lower conductive lines and a first insulating layer 55 are sequentially deposited over a semiconductor substrate (not shown) with an inter-metal dielectric 51 in the step of FIG. 4A. In this case the thickness of the first insulating layer 55 is about 1000Å. A second insulating layer 57 of about 1000Å thickness is formed over the substrate. The first insulating layer 55 consists of PSG, TiN or P—TEOS USG, and the second insulating layer 57 P—SiH$_4$ USG or O$_3$—TEOS USG. A sacrificial layer 59 formed of photoresist or spin-on glass is applied to the second insulating layer 57. The sacrificial layer is etched-back so as to expose the second insulating layer 57 on the patterned metal layers 53 and first insulating layers with the sacrificial layer portions remaining in the recesses between the patterned metal layers 53 in the step of FIG. 4B. The exposed portions of the second insulating layer 57 are removed by using the remaining sacrificial layer portions as a mask in the step of FIG. 4C. A third insulating layer 61 such as O$_3$—TEOS USG whose deposition rate depends on the property of the lower layer is formed over the first and second insulating layers after removing the remaining sacrificial layer portions. Namely, the deposition rate of the third insulating layer is greater in the region over the second insulating layer 57 than in the region over the first insulating layer 55. As a result the portions of the third insulating layer 61 between the metal layers have a thickness great enough to compensate for the depth of the recesses between the metal layers, thus preferably planarizing the inter-metal dielectric.

Thus according to the present invention, different insulating layers are exposed over different regions of a semiconductor substrate and an insulating layer whose deposition rate depends on the exposed lower layer is deposited, so that it is possible to control the thickness of the inter-metal dielectrics according to the different regions. Hence there are obtained the inter-metal dielectrics without voids and a good planarization, which increases the reliability of the semiconductor device.

Although specific constructions and procedures of the invention have been illustrated and described herein, it is not intended that the invention be limited to the elements and constructions disclosed. One skilled in the art will easily recognize that the particular elements or subconstructions may be used without departing from the scope and spirit of the invention.

What is claimed is:

1. A method for forming a planarized dielectric layer on a structure comprised of a semiconductor substrate and a patterned conductive layer formed thereon, whereby the topology of the structure consists of raised surface features defining recesses therebetween, the method comprising the steps of:

forming a first insulating layer on said structure;

forming a second insulating layer on said first insulating layer;

etching back said second insulating layer to remove portions of said second insulating layer disposed on said first insulating layer and above said raised surface features, but without removing any of said first insulating layer, to thereby expose portions of said first insulating layer disposed on said raised surface features and to leave remaining portions of said second insulating layer in said recesses; and, depositing a third insulating layer on said exposed portions of said first insulating layer at a first deposition rate, and depositing said third insulating layer within said recesses at a second deposition rate, wherein the difference between said first and second deposition rates is such as to result in the upper surface of said third insulating layer having a substantially flat profile.

2. The method as set forth in claim 1, wherein said first insulating layer is a material selected from a group consisting of PSG, O$_3$—TEOS PSG, O$_3$—TEOS BPSG, and P—TEOS undoped silicated glass.

3. The method as set forth in claim 2, wherein said second insulating layer is a material selected from a group consisting of plasma-enhanced silane undoped silicate glass and O$_3$—TEOS undoped silicate glass.

4. The method as set forth in claim 3, wherein said third insulating layer is comprised of O$_3$—TEOS undoped silicate glass.

5. A method for forming a planarized dielectric layer on a structure comprised of a semiconductor substrate and a patterned conductive layer formed thereon, whereby the topology of the structure consists of a raised surface features defining recesses therebetween, the method comprising the steps of:

forming a first insulating layer on said structure;

forming a second insulating layer on said first insulating layer;

applying a sacrificial layer on said second insulating layer;

etching back said sacrificial layer to expose portions of said second insulating layer disposed above said raised surface features, thereby leaving remaining portions of said sacrificial layer in said recesses;

removing said exposed portions of said second insulating layer by using said remaining portions of said sacrificial layer as a mask, to thereby expose portions of said first insulating layer disposed on said raised surface features;

removing said remaining portions of said sacrificial layer; and, depositing a third insulating layer on said exposed portions of said first insulating layer at a first deposition rate, and depositing said third insulating layer within said recesses at a second deposition rate, wherein the difference between said first and second deposition rates is such as to result int he upper surface of said third insulating layer having a substantially flat profile.

6. The method ass et forth in claim 5, wherein said sacrificial layer is comprised of a photoresist material.

7. The method as set forth in claim 5, wherein said sacrificial layer is comprised of spin-on-glass.

8. The method as set forth in claim 5, wherein said first insulating layer is a material selected from a group consisting of PSG, O$_3$—TEOS PSG, O$_3$—TEOS BPSG, and P-TEOS undoped silicated glass.

9. The method as set forth in claim 8, wherein said second insulating layer is a material selected from a group consisting of plasma-enhanced silane undoped silicate glass and $O_3$—TEOS undoped silicate glass.

10. The method as set forth in claim 9, wherein said third insulating layer is comprised of $O_3$—TEOS undoped silicate glass.

11. The method as set forth in claim 1, wherein said etching back step is carried out by using an anisotropic etching process, to thereby leave remaining portions of said second insulating layer on only sidewalls of said raised surface features.

* * * * *